United States Patent
Mayer et al.

(10) Patent No.: US 9,048,383 B2
(45) Date of Patent: Jun. 2, 2015

(54) LIGHT-EMITTING DIODE CHIP AND METHOD FOR PRODUCING A LIGHT-EMITTING DIODE CHIP

(75) Inventors: Bernd Mayer, Regensburg (DE); Wolfgang Schmid, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 55 days.

(21) Appl. No.: 13/809,149

(22) PCT Filed: Jun. 17, 2011

(86) PCT No.: PCT/EP2011/060158
§ 371 (c)(1),
(2), (4) Date: Mar. 29, 2013

(87) PCT Pub. No.: WO2012/004112
PCT Pub. Date: Jan. 12, 2012

(65) Prior Publication Data
US 2013/0175573 A1    Jul. 11, 2013

(30) Foreign Application Priority Data
Jul. 8, 2010 (DE) .......................... 10 2010 026 518

(51) Int. Cl.
| H01L 33/26 | (2010.01) |
| H01L 33/44 | (2010.01) |
| H01L 33/02 | (2010.01) |
| H01L 33/20 | (2010.01) |

(52) U.S. Cl.
CPC ................ *H01L 33/26* (2013.01); *H01L 33/025* (2013.01); *H01L 33/20* (2013.01); *H01L 33/44* (2013.01); *H01L 2933/0025* (2013.01)

(58) Field of Classification Search
CPC ....................................................... H01L 21/00
See application file for complete search history.

(56) References Cited

U.S. PATENT DOCUMENTS

| 6,201,264 | B1 | 3/2001 | Khare et al. |
| 2005/0194584 | A1 | 9/2005 | Slater et al. |
| 2008/0237629 | A1 | 10/2008 | Ando et al. |
| 2012/0319299 | A1* | 12/2012 | Albrecht et al. ............ 257/774 |

FOREIGN PATENT DOCUMENTS

| EP | 0838861 | 4/1998 |
| EP | 1225670 | 7/2002 |
| JP | 60-101989 | 6/1985 |
| JP | 3-103317 U | 10/1991 |
| JP | 9-162441 | 6/1997 |
| JP | 2006-528435 A | 12/2006 |
| JP | 2008-235362 A | 10/2008 |
| WO | 2010020070 | 2/2010 |

* cited by examiner

*Primary Examiner* — Fernando L Toledeo
*Assistant Examiner* — Valerie N Newton
(74) *Attorney, Agent, or Firm* — McDermott Will & Emery LLP (57) ABSTRACT

The invention relates to a light-emitting diode chip, comprising an n-type semiconductor layer (3), a p-type semiconductor layer (4), an active region (2) between the n-type semiconductor layer (3) and the p-type semiconductor layer (4), a lateral surface (14), which limits the n-type semiconductor layer (3), the p-type semiconductor layer (4) and the active region (2) in a lateral direction, and a doped region (1), in which a dopant is introduced into a semiconductor material of the light-emitting diode chip, and/or comprising a neutralized region (1), wherein the doped region (1) and/or the neutralized region (1) are formed at the lateral surface (14) at least in the region of the active region, and the light-emitting diode chip is intended to emit incoherent electromagnetic radiation during operation.

13 Claims, 4 Drawing Sheets

LIGHT-EMITTING DIODE CHIP AND METHOD FOR PRODUCING A LIGHT-EMITTING DIODE CHIP

Light-emitting diode chip and method for producing a light-emitting diode chip

A light-emitting diode chip is specified. Furthermore, a method for producing a light-emitting diode chip is specified.

It has been found that light-emitting diode chip singulation technologies such as laser separation or sawing entail the risk of damage to the side faces of the light-emitting diode chips which are produced by the singulation. Especially in the case of separation by laser radiation, this can lead to a low-current weakness of the devices produced in this way. Said low-current weakness is initiated, for example, by slag from the separating process which deposits at the side face of the light-emitting diode chip that is produced by singulation, or by reflections of the laser beam used for separation into the side face of the light-emitting diode chip. During singulation of a light-emitting diode chip, both mechanisms have the effect that an electrical parallel path forms with respect to the optically active region of the light-emitting diode chip. Said electrical parallel path leads to a low-current weakness. What proves to be particularly disadvantageous in this case is that this fault pattern often becomes noticeable only in the final measurement of the light-emitting diode chip, that is to say at the end of the value creating chain.

One object to be achieved is to specify a light-emitting diode chip which is particularly stable electrically, that is to say has a reduced low-current weakness. A further object to be achieved is to specify a method for producing such a light-emitting diode chip.

In accordance with at least one embodiment of the light-emitting diode chip, the latter is provided for emitting incoherent electromagnetic radiation during operation. That is to say that the light-emitting diode chip is especially not a laser, which emits coherent electromagnetic radiation during operation, but rather a light-emitting diode chip which emits incoherent electromagnetic radiation for example into a large solid angle range.

In accordance with at least one embodiment of the light-emitting diode chip, the light-emitting diode chip comprises an n-conducting semiconductor layer, a p-conducting semiconductor layer and an active region arranged between the n-conducting semiconductor layer and the p-conducting semiconductor layer. The conducting semiconductor layers are, for example, correspondingly doped layers composed of a semiconductor material which are grown for example epitaxially one above another. At the interface of the n-conducting semiconductor layer and the p-conducting semiconductor layer, an active region is formed, comprising for example at least one radiation-emitting layer in which electromagnetic radiation is generated during the operation of the light-emitting diode chip.

In accordance with at least one embodiment of the light-emitting diode chip, the light-emitting diode chip comprises a side face delimiting the n-conducting semiconductor layer, the p-conducting semiconductor layer and the active region in a lateral direction. The side face is therefore a flank of the light-emitting diode chip. In this case, the light-emitting diode chip can comprise for example four side faces which connect a bottom face of the light-emitting diode chip and a top face of the light-emitting diode chip to one another. The light-emitting diode chip is delimited by its at least one side face in a lateral direction, that is to say in a direction for example perpendicularly or transversely with respect to a growth direction of the semiconductor layers. In other words, the semiconductor material of the light-emitting diode chip ends at the side face. The side face can then adjoin a surrounding medium, for example a passivation layer, an encapsulation body or air.

In accordance with at least one embodiment of the light-emitting diode chip, the light-emitting diode chip comprises a doping region. In the doping region, a dopant is introduced into a semiconductor material of the light-emitting diode chip. The dopant is in this case for example a dopant which differs from the dopants with which the n-conducting semiconductor layer and the p-conducting semiconductor layer are n- and p-doped, respectively. In this case, the doping region is formed at the side face at least in the region of the active region. That is to say that at the side face of the light-emitting diode chip, the doping region is formed in the region of the active region. In this case, it is possible for the doping region also to extend over other layers of the light-emitting diode chip, for example the n-conducting semiconductor layer and the p-conducting semiconductor layer, along the side face. The fact that the doping region is formed at the side face furthermore means that a central region of the light-emitting diode chip, which is remote from the side face, is free or substantially free of the dopant of the doping region. In other words, the doping region is formed locally at the side face, in this case at least in the region of the active region. The dopant converts for example an n-conducting region in the region of the side face for example at and/or around the active region into a p-conducting region. That is to say that the dopant overcompensates for the n-type doping present. Conversely, such a redoping is also possible for reversing the doping of p-conducting regions to form n-conducting regions. The actual radiation-generating region is thereby shifted from the side faces into the interior of the light-emitting diode chip. The diffusion region therefore has the effect of displacing a pn junction into a material having a higher band gap.

In accordance with at least one embodiment of the light-emitting diode chip, an n-conducting and/or a p-conducting region are/is neutralized in the region of the side face for example at and/or around the active region. For this purpose, the respective dopant is neutralized for example by means of hydrogen, such that the n-conducting and/or p-conducing region treated in this way becomes an intrinsically conducting semiconductor region. In other words, the light-emitting diode chip then comprises a neutralized region formed at the side face at least in the region of the active region.

In accordance with at least one embodiment of the light-emitting diode chip, the light-emitting diode chip comprises an n-conducting semiconductor layer, a p-conducting semiconductor layer and an active region arranged between the n-conducting semiconductor layer and the p-conducting semiconductor layer. Furthermore, the light-emitting diode chip comprises a side face delimiting the n-conducting semiconductor layer, the p-conducting semiconductor layer and the active region in a lateral direction, and a doping region, in which a dopant is introduced into a semiconductor material of the light-emitting diode chip, and/or a neutralized region. In this case, the doping region and/or the neutralized region are/is formed at the side face at least in the region of the active region. The light-emitting diode chip is provided for emitting incoherent electromagnetic radiation during operation, that is to say that, during the operation of the light-emitting diode chip, the latter emits incoherent electromagnetic radiation. The doping region and/or neutralized region can be formed at all side faces of the light-emitting diode chip.

In this case, the light-emitting diode chip described here is based, inter alia, on the following principle: in the region of the side face, the active region is converted into a semiconductor of the same conduction type for example by indiffusion of a suitable dopant. That is to say that the original n- or p-type doping is overcompensated for by the additional dopant. An originally n-doped region, for example, becomes a weakly p-doped region. The actual active region provided for generating radiation is shifted away from the side face into the interior of the light-emitting diode chip by means of the doping region.

Alternatively or additionally, a neutralization as described above can be effected at the side face.

Overall, at the side face there is now hardly any voltage drop or no longer any voltage drop, such that a further short-circuit path such as, for example, the slag discussed above has no influence on the electrical and optical behavior of the light-emitting diode chip. It is therefore not necessary to apply an additional layer for electrical insulation at the side face of the light-emitting diode chip.

In accordance with at least one embodiment of the light-emitting diode chip, the doping region and/or the neutralized region are/is formed at the entire side face of the light-emitting diode chip. That is to say that the doping region and/or the neutralized region extend(s) over the entire semiconductor material of the light-emitting diode chip at the side faces thereof, preferably at all side faces of the light-emitting diode chip.

In accordance with at least one embodiment of the light-emitting diode chip, the doping region and/or the neutralized region have/has, measured from the side face into the light-emitting diode chip, a thickness of at least 10 nm and at most 100 μm. The minimum thickness ensures a sufficient protection of the side face. The penetration depth of the doping region and/or of the neutralized region is preferably limited, such that enough space for forming the optically active region is available in the interior of the semiconductor chip. The boundary of the doping region, for example, that is arranged in the semiconductor material of the light-emitting diode chip is assumed to be where a concentration of the dopant with which the doping region is formed has fallen to 1/e of its maximum concentration in the semiconductor material of the light-emitting diode chip. The same correspondingly holds true for example for the introduction of hydrogen in the neutralized region.

In accordance with at least one embodiment of the light-emitting diode chip, the active region and preferably also the n-conducting layer and the p-conducting layer are based on a nitride compound semiconductor material. In this context, "based on a nitride compound semiconductor material" means that the active region and, if appropriate, said semiconductor layers or at least parts thereof comprise or consist of a nitride compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, the material comprises one or more dopants which provide for example for the n- and p-type conductivity, respectively, of the layers mentioned.

In accordance with at least one embodiment of the light-emitting diode chip, the active region and preferably also the n-conducting layer and the p-conducting layer are based on a phosphide compound semiconductor material. In this context, "based on a phosphide compound semiconductor material" means that the active region and, if appropriate, said semiconductor layers or at least one part thereof comprise $Al_nGa_mIn_{1-n-m}P$ or $As_nGa_mIn_{1-n-m}P$, wherein $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which provide for example for the n- and p-type conductivity, respectively, of the layers mentioned.

In accordance with at least one embodiment of the light-emitting diode chip, the active region and preferably also the n-conducting layer and the p-conducting layer are based on an arsenide compound semiconductor material. In this context, "based on an arsenide compound semiconductor material" means that the active region and, if appropriate, said semiconductor layers or at least parts thereof comprise or consist of an arsenide compound semiconductor material, preferably $Al_nGa_mIn_{1-n-m}As$, wherein $0 \leq n \leq 1$, $0 \leq m \leq 1$ and $n+m \leq 1$. In this case, this material need not necessarily have a mathematically exact composition according to the above formula. Rather, the material comprises one or more dopants which provide for example for the n- and p-type conductivity, respectively, of the layers mentioned.

Preferably, the dopant for forming the doping region is in this case zinc or magnesium.

In accordance with at least one embodiment of the light-emitting diode chip, the side face is free of a further passivation layer at least in the region of the active region. That is to say that, on account of the fact that the doping region and/or the neutralized region contribute(s) to an electrical passivation of the side face, applying a further insulating material such as, for example, silicon dioxide or silicon nitride can be dispensed with at least in the region of the active region at the side face.

In accordance with at least one embodiment of the light-emitting diode chip, a further passivation layer is applied in addition to the doping region. The light-emitting diode chip is thus distinguished by a particularly good electrical behavior since residues of a singulation process that are covered by the further passivation layer cannot lead to a low-current weakness of the light-emitting diode chip on account of the presence of the doping region. Furthermore, such a further passivation layer can also prove to be advantageous as mechanical and chemical protection of the light-emitting diode chips.

In accordance with at least one embodiment of the light-emitting diode chip, the side face runs transversely with respect to a growth direction of the n-conducting semiconductor layer and of the p-conducting semiconductor layer. By way of example, the side face runs at an angle of <90°, preferably <50°, with respect to a carrier on which the semiconductor layers mentioned are arranged.

A method for producing a light-emitting diode chip is furthermore specified. In particular a light-emitting diode chip described here can be produced by means of the method. That is to say that the features disclosed for the light-emitting diode chip are also disclosed for the method, and vice versa.

In accordance with at least one embodiment of the method, the method involves firstly providing a growth substrate. The n-conducting semiconductor layer, the active region and the p-conducting semiconductor layer are deposited onto the growth substrate preferably in direct succession. In this case, one or more further layers, such as, for example, buffer layers, can be arranged between the layers mentioned and the growth substrate.

In a subsequent method step, a plurality of diffusion regions and/or neutralized regions are formed in the active region. The diffusion regions are preferably produced by locally introducing the dopant by means of selective indiffusion of the dopant. In this case, the dopant can be introduced into the active region for example from a side of the active region which faces away from the growth substrate, for example from the side of the p-conducting semiconductor layer which faces away from the growth substrate. The selective indiffusion can be effected for example by the definition of a mask or the use of a structured diffusion source. The neutralized regions can be produced for example by ion implantation of hydrogen ions.

A subsequent method step involves singulating through a plurality, preferably all, of the diffusion regions and/or neutralized regions, wherein side faces of the light-emitting diode chips to be produced are produced in which the doping region and/or the neutralized region are/is formed at one of the side faces at least in the region of the active region. In other words, the doping region and/or the neutralized region of the light-emitting diode chip are/is produced by singulation through the diffusion region and/or the neutralized region.

Preferably, the process of forming the diffusion regions and/or the neutralized regions in the active region in the method described here is effected prior to applying temperature-sensitive materials such as metals, for example. That is to say that the diffusion is effected, in particular, before the formation of metallic contacts and/or metallic mirrors of the light-emitting diode chip. As a result, the diffusion of the doping region into the semiconductor material can be supported by a relatively great increase in temperature, for example to temperatures of >280° C.

In accordance with at least one embodiment of the method, the diffusion region and thus the doping region produced by means of the diffusion region and/or the neutralized region extend(s) through the n-conducting semiconductor layer, the active region and the p-conducting semiconductor layer. That is to say that, at all side faces laterally delimiting the semiconductor material of the light-emitting diode chip after completion of the light-emitting diode chip, the doping region is formed over the whole area and extends over the entire side face.

As an alternative to the production method described, it is also possible to introduce the dopant locally via the side faces of the light-emitting diode chip, that is to say after singulation of the light-emitting diode chip. In this case, there is no need to effect singulation through the diffusion regions.

The light-emitting diode chip described here and the method described here are explained in greater detail below on the basis of exemplary embodiments and the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

Figure 1:
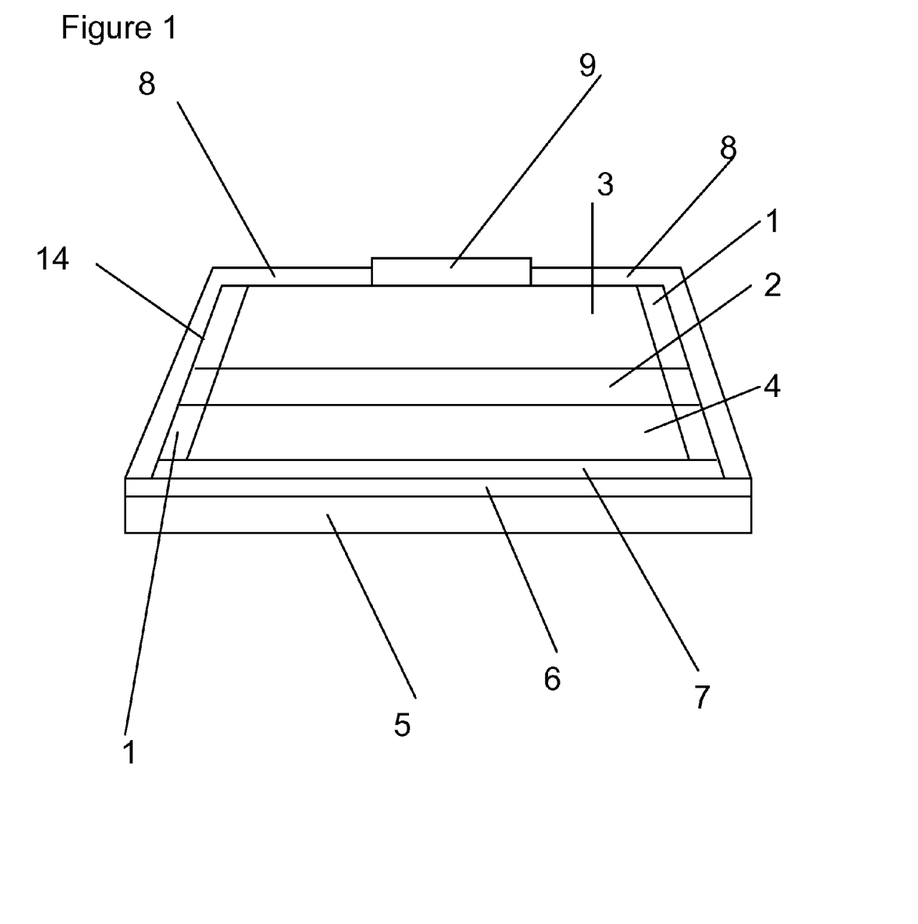
FIG. 1 shows an exemplary embodiment of a light-emitting diode chip described here on the basis of a schematic sectional illustration.

The schematic sectional illustration in FIG. 1 shows an exemplary embodiment of a light-emitting diode chip described here. In the exemplary embodiment in FIG. 1, the light-emitting diode chip comprises a carrier 5. The carrier 5 is formed with an electrically conducting material, for example. In this case, the carrier 5 can for example contain germanium or consist of germanium, contain silicon or consist of silicon and be formed by a metal and produced galvanically, for example.

A solder layer 6, which can contain gold, for example, is arranged at the top side of the carrier 5. A mirror layer, which contains silver and/or aluminum, for example, is arranged at that side of the solder layer 6 which faces away from the carrier 5. The semiconductor layers of the light-emitting diode chip succeed the mirror layer 7 at its side facing away from the solder layer 6. In this case, the light-emitting diode chip comprises a p-conducting semiconductor layer 4, an n-conducting semiconductor layer 3 and an active region 2 arranged between the two semiconductor layers. The active region is the radiation-generating region of the light-emitting diode chip. By way of example, electromagnetic radiation from the UV range, from the visible spectral range or the infrared range is generated in the active region during the operation of the light-emitting diode chip.

In a lateral direction, that is to say for example parallel to the top side of the carrier 5, at which the semiconductor layers of the light-emitting diode chip are arranged, the semiconductor layers 2, 3, 4 are delimited by side faces 14. In the present case, the side faces 14 run at an angle of <90° with respect to the top side of the carrier.

A doping region 1 is formed at the side faces 14, in which doping region a dopant is introduced into the semiconductor material of the light-emitting diode chip. The dopant is zinc, for example; the semiconductor layers 2, 3, 4 of the light-emitting diode chip are based for example on a nitride compound semiconductor material.

The doping region is formed at the side face in the region of the active region 2 and in the present case extends over the entire side face 14, that is to say also over the n-conducting semiconductor layer 3 and the p-conducting semiconductor layer 4. The band gap of the semiconductor material of the semiconductor layers of the light-emitting diode chip is greater in the doping region 1 than in the active region outside the doping region 1. The penetration depth of the dopant forming the doping region, that is to say the thickness of the doping region 1, calculated from the side face 14, is in this case a maximum of 100 µm, for example.

The doping region 1 forms an electrical passivation at the side face 14, which improves the low-current behavior of the light-emitting diode chip by comparison with a light-emitting diode chip without a doping region 1 at the side faces 14.

For example as an alternative to the doping region 1, a neutralized region 1 as described above can be used.

In addition to the electrical passivation by the doping region 1, the exposed outer areas of the light-emitting diode chip apart from the region covered by the n-type electrode are coated with a passivation layer 8, which consists of silicon nitride, for example. The passivation layer 8 covers and in this case also encapsulates the mirror layer 7 at its side faces.

Figure 2A:
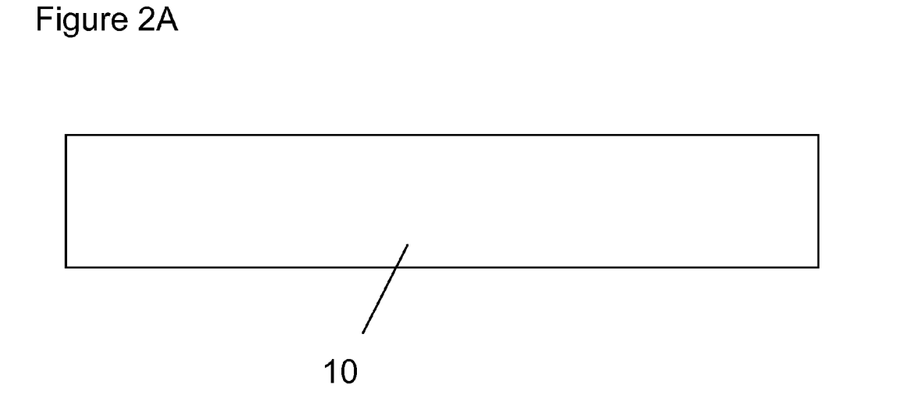
FIGS. 2A, 2B, 2C, 2D, 2E and 2F show an exemplary embodiment of a method described here on the basis of schematic sectional illustrations.
Figure 2B:
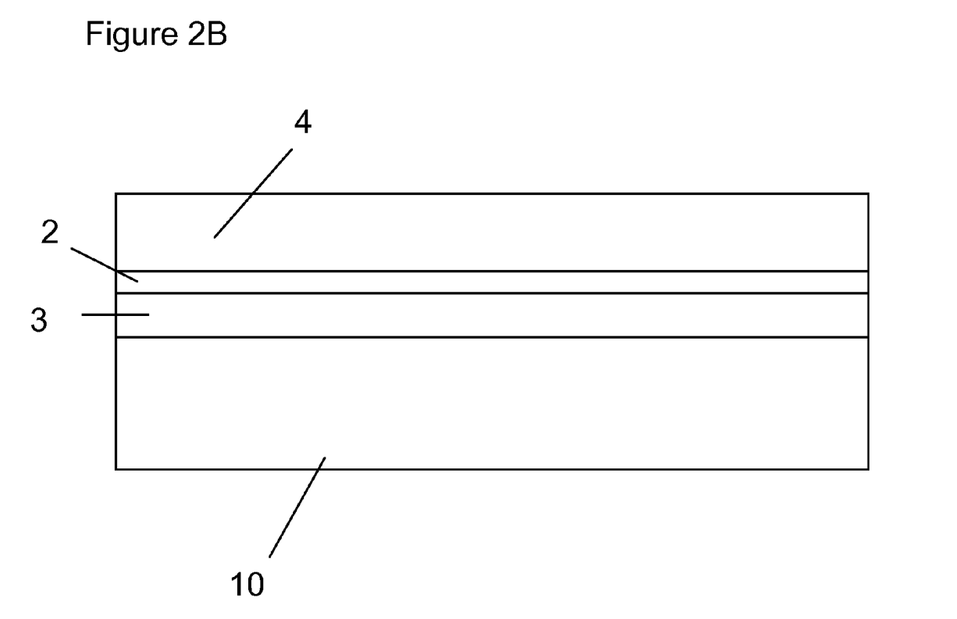
Figure 2C:
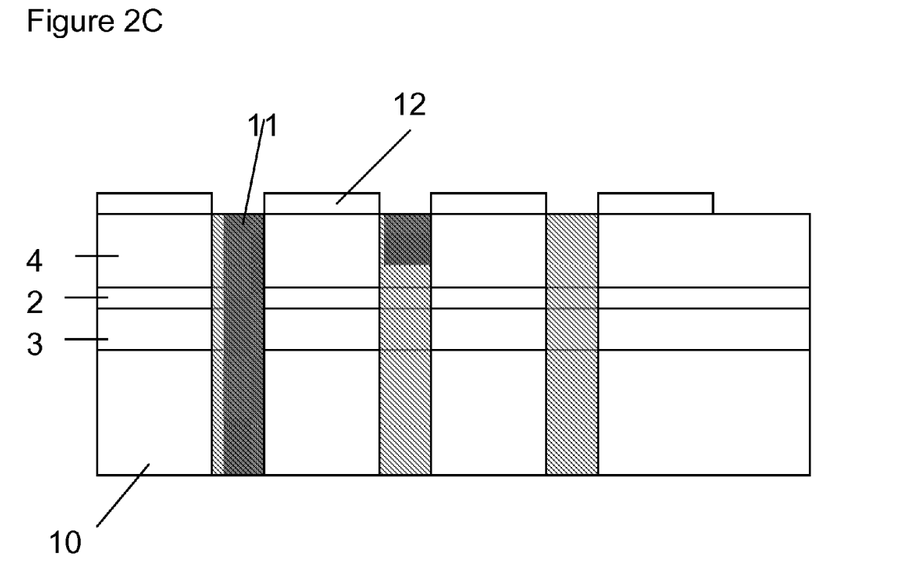
Figure 2D:
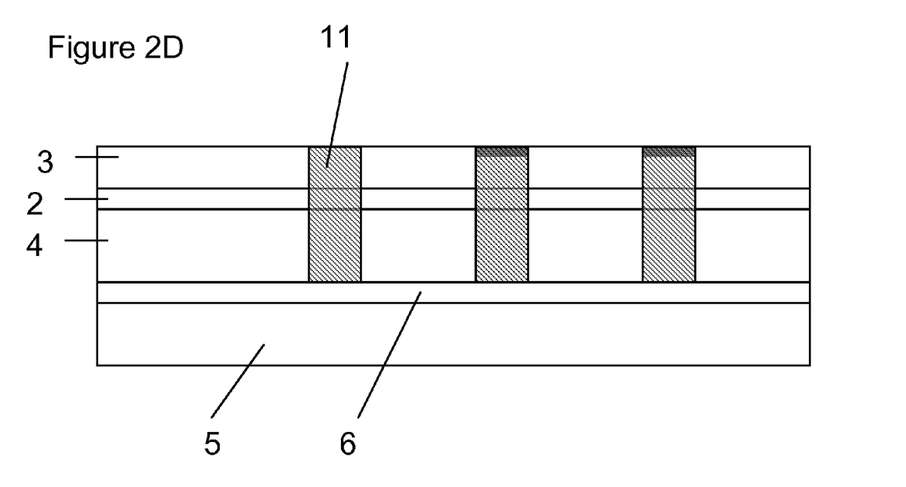
Figure 2E:
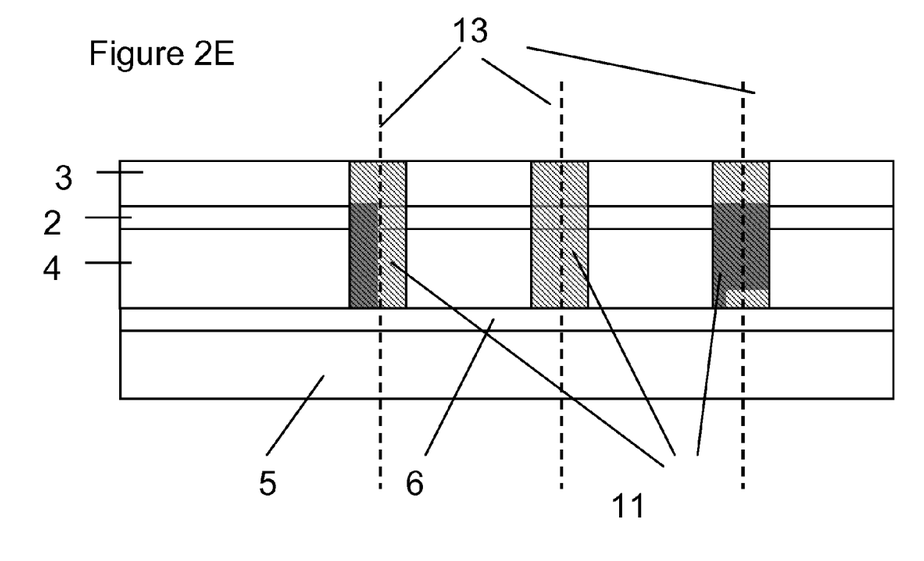
Figure 2F:
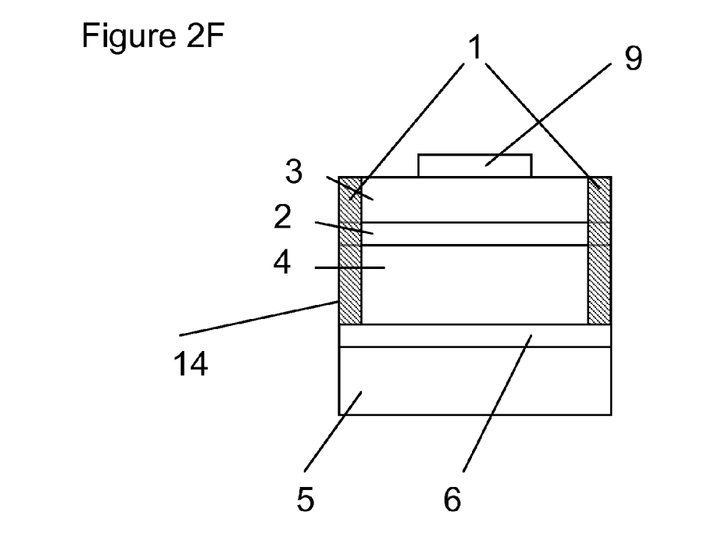

On account of the doping region described here, however, it is possible to dispense with the passivation layer 8 at least in the region of the active region (in this respect, also see FIG. 2F, which shows a further exemplary embodiment of a light-emitting diode chip described here in sectional illustration, said chip being free of a further passivation layer 8).

An exemplary embodiment of a method described here for producing a light-emitting diode chip described here is explained in greater detail in conjunction with the schematic sectional illustrations in FIGS. 2A to 2F. In the first method step (FIG. 2A), a growth substrate 10 is provided, which for example is formed with sapphire or consists of sapphire. Alternatively, the growth substrate 10 can for example also be formed with SiC or GaAs.

Afterward, the n-conducting semiconductor layer 3, the active region 2 and the p-conducting semiconductor layer 4 are deposited epitaxially onto a growth surface of the growth substrate 10; in this respect, see FIG. 2B.

As described in conjunction with FIG. 2C, a mask 12 is subsequently patterned at that side of the p-conducting semiconductor layer 4 which faces away from the growth substrate 10. A dopant for forming the diffusion regions 11 is indiffused into the regions not covered by the mask. In this method stage, the semiconductor wafer with the semiconductor layers mentioned does not yet comprise a temperature-sensitive material such as a contact metal or a mirror metal, for example. The semiconductor layers can therefore be heated greatly in order to support the indiffusion of the dopant. In this case, it is possible for the dopant not just to indiffuse into the semiconductor layers 2, 3, 4, but rather to pass right into the growth substrate 10.

In a subsequent method step, the semiconductor layers 2, 3, 4, at their side facing away from the growth substrate 10, are fixed, for example soldered, on a carrier 5 by means of a solder layer 6 (a mirror layer 7 can optionally be present). The growth substrate 10 is subsequently removed wet-chemically or by means of a laser separating method (FIG. 2D).

With reference to FIG. 2E it is shown that singulation is effected through the diffusion regions 11 along the separating lines 13 for example by means of a laser separating method. In this case, slag that possibly deposits at the side faces 14 does not lead to a deterioration in the low-current behavior of the light-emitting diode chip, since it is deposited on the doping regions 1 produced by the singulation, which doping regions have an electrically insulating effect.

In a further method step, see FIG. 2F, for example, an n-type electrode can be applied on that side of the n-conducting semiconductor layer 3 which faces away from the carrier 5. This can also be effected prior to singulation.

For example as an alternative to the doping region 1, a neutralized region 1 as described above can be used by virtue of neutralized regions 11 being produced—for example by implantation of hydrogen ions.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 102010026518.7, the disclosure content of which is hereby incorporated by reference.

The invention claimed is:

1. A light-emitting diode chip comprising:
an n-conducting semiconductor layer;
a p-conducting semiconductor layer;
an active region between the n-conducting semiconductor layer and the p-conducting semiconductor layer;
a side face delimiting the n-conducting semiconductor layer, the p-conducting semiconductor layer, and the active region in a lateral direction;
a doping region, in which a dopant is introduced into a semiconductor material of the light-emitting diode chip
wherein the doping region is formed at the side face at least in the region of the active region, and the light-emitting diode chip is provided for emitting incoherent electromagnetic radiation during operation,
wherein the doping region forms an electrical passivation at the side face, and
wherein a dopant in the doping region converts an n-conducting region in the region of the side face at or around the active region into a p-conducting region or a p-conducting region in the region of the side face at or around the active region into an n-conducting region.

2. The light-emitting diode chip according to claim 1, further comprising a neutralized region which is formed at the side face at least in the region of the active region.

3. The light-emitting diode chip according to claim 2, wherein the doping region or the neutralized region reduces the electrical conductivity at the side face.

4. The light-emitting diode chip according to claim 2, wherein the doping region or the neutralized region are formed at the entire side face.

5. The light-emitting diode chip according to claim 2, wherein the doping region or the neutralized region have from the side face a thickness of at least 10 nm and at most 100 μm.

6. The light-emitting diode chip according to claim 2, wherein the active region is based on a nitride compound semiconductor material and the dopant is zinc or magnesium.

7. The light-emitting diode chip according to claim 2, wherein the side face is free of a further passivation layer at least in the region of the active region.

8. The light-emitting diode chip according to claim 2, wherein the side face runs transversely with respect to a growth direction of the n-conducting semiconductor layer and the p-conducting semiconductor layer.

9. A method for producing a light-emitting diode chip comprising the following steps:
providing a growth substrate;
producing an n-conducting semiconductor layer, an active region and a p-conducting semiconductor layer on the growth substrate;
forming a plurality of diffusion regions or a plurality of neutralized regions at least in the active region; and
singulating through a plurality of the diffusion regions or the neutralized regions in order to produce side faces of light-emitting diode chips in which a doping region or a neutralized region are formed at each of the side faces at least in the region of the active region and form an electrical passivation,
wherein the light-emitting diode chip is provided for emitting incoherent electromagnetic radiation during operation.

10. The method according to claim 9 further comprising the following steps:
forming a plurality of neutralized regions at least in the active region; and
singulating through a plurality of the neutralized regions in order to produce side faces of light-emitting diode chips in which a neutralized region is formed at each of the side faces at least in the region of the active region.

11. The method according to claim 10, wherein the dopant is introduced into the active region from a side of the active region which faces away from the growth substrate.

12. The method according to claim 10, wherein the diffusion region or the neutralized region extends through the n-conducting semiconductor layer, the active region and the p-conducting semiconductor layer.

13. The method according to claim 10,
wherein the active region is between the n-conducting semiconductor layer and the p-conducting semiconductor layer,
wherein at least one side face delimits the n-conducting semiconductor layer, the p-conducting semiconductor layer, and the active region in a lateral direction,
wherein for at least one doping region, a dopant is introduced into a semiconductor material of the light-emitting diode chip, and wherein the at least one doping region or the neutralized region are formed at the at least one side face at least in the region of the active region.

* * * * *

UNITED STATES PATENT AND TRADEMARK OFFICE
CERTIFICATE OF CORRECTION

PATENT NO.         : 9,048,383 B2                                    Page 1 of 1
APPLICATION NO.    : 13/809149
DATED              : June 2, 2015
INVENTOR(S)        : Bernd Mayer et al.

It is certified that error appears in the above-identified patent and that said Letters Patent is hereby corrected as shown below:

IN THE CLAIMS:

Please amend claim 9 at column 8, line 31, as follows:

9. A method for producing a light-emitting diode chip comprising the following steps:
providing a growth substrate;
producing an n-conducting semiconductor layer, an active region and a p-conducting semiconductor layer on the growth substrate;
forming a plurality of diffusion regions at least in the active region;
and singulating through a plurality of the diffusion regions in order to produce side faces of light-emitting diode chips in which a doping region is formed at each of the side faces at least in the region of the active region and forms an electrical passivation, a dopant in the doping region converting an n-conducting region in the region of the side face at or around the active region into a p-conducting region or a p-conducting region in the region of the side face at or around the active region into an n-conducting region, wherein the light-emitting diode chip is provided for emitting incoherent electromagnetic radiation during operation.

Signed and Sealed this
Third Day of November, 2015

Michelle K. Lee
*Director of the United States Patent and Trademark Office*